United States Patent
Yano (10) Patent No.: US 6,987,381 B2
(45) Date of Patent: Jan. 17, 2006

(54) APPARATUS FOR ADJUSTING WAVEFORM DISPLAY POSITION IN WAVEFORM DISPLAY

(75) Inventor: Koji Yano, Kanagawa (JP)

(73) Assignee: Leader Electronics Corporation, Kanagawa-ken (JP)

( * ) Notice: Subject to any disclaimer, the term of this patent is extended or adjusted under 35 U.S.C. 154(b) by 173 days.

(21) Appl. No.: 10/386,533

(22) Filed: Mar. 13, 2003

(65) Prior Publication Data

US 2003/0174134 A1 Sep. 18, 2003

(30) Foreign Application Priority Data

Mar. 14, 2002 (JP) .................................. 2002-069657

(51) Int. Cl.
*G01R 13/20* (2006.01)
*G06F 19/00* (2006.01)

(52) U.S. Cl. ................................. 324/121 R; 702/67
(58) Field of Classification Search ............. 324/121 R, 324/76.12, 76.27, 76.35, 115; 702/66–68, 702/70; 345/134, 157–159, 172, 440.1
See application file for complete search history.

(56) References Cited

U.S. PATENT DOCUMENTS

| | | | | |
|---|---|---|---|---|
| 4,578,640 A | * | 3/1986 | Crooke et al. ........... | 324/121 R |
| 4,647,915 A | * | 3/1987 | Shank et al. ............ | 324/121 R |
| 4,743,844 A | * | 5/1988 | Odenheimer et al. ... | 324/121 R |
| 4,977,514 A | * | 12/1990 | Bush ...................... | 324/121 R |
| 5,003,248 A | * | 3/1991 | Johnson .................. | 324/121 R |
| 5,075,618 A | * | 12/1991 | Katayama ................ | 324/121 R |
| 6,025,833 A | * | 2/2000 | Duff ........................ | 324/121 R |
| 6,195,080 B1 | * | 2/2001 | Etheridge ................ | 324/121 R |
| 6,225,972 B1 | * | 5/2001 | Taraki et al. ............ | 324/121 R |

OTHER PUBLICATIONS

Sony/Tektronix Catalog and User Manual (in English); "WFM 1125 Digital Television Waveform Monitor Option 0A/0B/0C/0D–071–0260–04"; 9 total pages; no date.
Sony/tektronix Catalog (in Jakpanes); "WFM 1125 Digital Television Waveform Monitor Option 0A–HDTV"; 1 page; Jul. 1998.

* cited by examiner

*Primary Examiner*—Evan Pert
*Assistant Examiner*—Jermele Hollington
(74) *Attorney, Agent, or Firm*—Fish & Richardson P.C.

(57) ABSTRACT

A waveform display position adjusting apparatus is provided for more conveniently and rapidly adjusting a position at which a waveform is displayed on a waveform display device. The apparatus is configured to adjust a position at which a waveform represented by a waveform input signal is displayed on the display device having a two-dimensional display area. The apparatus comprises a mapping unit for mapping a two-dimensional waveform value space for a waveform input value derived from the waveform input signal to the two-dimensional display area of the display device, and a mapping adjusting unit coupled to the mapping unit for adjusting the mapping. The mapping adjusting unit comprises a continuous mapping adjusting section coupled to the mapping unit for continuous adjusting of the mapping. The mapping adjusting unit also comprises a mapping resetting section coupled to the mapping unit and arranged adjacent to the continuous mapping adjusting section for resetting of the mapping to a predetermined reference state when it is operated.

17 Claims, 6 Drawing Sheets

REFERENCE STATE

Fig. 6B

WHEN H-POSITION IS CHANGED

Fig. 6C

WHEN V-POSITION IS CHANGED

APPARATUS FOR ADJUSTING WAVEFORM DISPLAY POSITION IN WAVEFORM DISPLAY

BACKGROUND OF THE INVENTION

The present invention relates to a method and apparatus for adjusting a position at which a waveform is displayed on a waveform display device such as a cathode ray tube (CRT) and a liquid crystal display (LCD) device.

Conventionally, in a waveform display device such as a waveform monitor for displaying a waveform of a video signal, scales are provided, for example, on the vertical axis and horizontal axis on a screen of the display device, i.e., a two-dimensional waveform display area, such that an amplitude, time and the like of the displayed waveform are observed based on the scales. Such a monitor is provided with a vertical (V) position adjustor knob and a horizontal (H) position adjustor knob for observing a waveform, moving a displayed waveform on the screen, or adjusting the position thereof. These position adjustor knobs include, for example, rotary encoders, and move a displayed waveform on the screen by distances corresponding to angles over which the knobs are rotated to adjust the position at which the waveform is displayed.

However, when a displayed waveform is, for example, enlarged, the displayed position may be varied vertically and horizontally with the position adjustor knobs to place the waveform at a position at which an operator can readily view an arbitrary portion of the waveform. In such a case, the operator often experiences difficulties in fine position adjustments when the enlarged display is released to return the waveform to the reference position. More specifically, the resolution of the position adjustment by the adjustor knobs is set high to permit fine adjustments, so that the knobs must be rotated over large angles to move a waveform over a long distance to accurately place the waveform at a relatively remote target position. Moreover, fine adjustments are required near the target position to accurately place the waveform at the target position. Thus, the positioning of a displayed waveform is time-consuming and laborious, and may involve a problem from the viewpoint of rapid measurement.

In this regard, a conventional waveform monitor can reset a position at which a waveform is displayed in the vertical direction. This monitor, however, forces an operator to select a menu and again select a reset function from the menu for resetting a displayed waveform to a reference state in which a zero point on the waveform matches a zero point on the scale on the vertical axis.

SUMMARY OF THE INVENTION

It is therefore an object of the present invention to provide a waveform display position adjusting method and apparatus which enable a simpler and more rapid adjustment of a position at which a waveform is displayed on a waveform display device.

It is another object of the present invention to provide a waveform display position adjusting method and apparatus which improve the operability for adjusting a position at which a waveform is displayed.

It is a further object of the present invention to provide a display device which comprises the waveform display position adjusting apparatus as mentioned above.

To achieve the above objects, a waveform display position adjusting method according to the present invention is provided for adjusting a position at which a waveform is displayed on a waveform display device which has a two-dimensional display area. The method includes the steps of: continuously adjusting mapping of a waveform input value in a two-dimensional waveform value space to the two-dimensional display area by using continuous adjusting means; and resetting the mapping to a reference state by using switching means arranged adjacent to the continuous adjusting means.

Also, a waveform display position adjusting apparatus according to the present invention is provided for adjusting a position at which a waveform represented by a waveform input signal is displayed on a waveform display device having a two-dimensional display area. The apparatus includes mapping means for mapping a two-dimensional waveform value space for a waveform input value derived from the waveform input signal to the two-dimensional display area of the waveform display device; and mapping adjusting means coupled to the mapping means for adjusting the mapping. The mapping adjusting means includes continuous mapping adjusting means coupled to the mapping means for continuously adjusting the mapping; and mapping resetting means coupled to the mapping means and arranged adjacent to the continuous mapping adjusting means for resetting the mapping to a predetermined reference state.

According to the present invention, the mapping adjustment may include an adjustment of a position of the two-dimensional waveform value space relative to the two-dimensional display area in the mapping. The two-dimensional display area may have an X-axis and a Y-axis. The reference state may have an X-axis reference state for the X-axis, wherein a reference point in the two-dimensional waveform value space is located at an X-axis reference position in the two-dimensional display area, and a Y-axis reference state for the Y-axis, wherein a reference point in the two-dimensional waveform value space is located at a Y-axis reference position in the two-dimensional display area. The reference point in the two-dimensional waveform value space may be situated at a point at which a value on the X-axis and a value on the Y-axis are both zero. The mapping may be reset to the reference state for one or both of the X-axis reference state and the Y-axis reference state.

In the waveform display position adjusting method according to the present invention, the mapping may include the steps of defining a memory address space specified by an X-address and a Y-address corresponding to the two-dimensional display area including the X-axis and the Y-axis on the display device; generating, from the waveform input signal, waveform value information on a waveform represented by the waveform input signal, and temporal information related to the waveform value information; generating, from the waveform value information, the Y-address for specifying an address in the memory address space; and generating, from the temporal information, the X-address for specifying the address in the memory address space. Also, the adjustment of the mapping in the continuous adjusting step and the resetting step may include the steps of generating an X-address changing amount and a Y-address changing amount corresponding to a mapping adjustment amount; and adding the X-address changing amount and the Y-address changing amount to the X-address and the Y-address, respectively. Further, the resetting step may include setting the X-address changing amount equal to a predetermined X-address reference value corresponding to the X-axis reference position in the two-dimensional display area when the mapping resetting means is operated for the X-axis; and setting the Y-address changing amount equal to a predetermined Y-address reference value corresponding to the Y-axis reference position in the two-dimensional display area when the mapping resetting means is operated for the Y-axis.

In the waveform display position adjusting apparatus according to the present invention, the continuous mapping adjusting means and the mapping resetting means may include a set of a rotary encoder and a reset switch associated with the X-axis, or a set of a rotary encoder and a reset switch associated with the Y-axis. The mapping means may include frame memory means having a memory address space corresponding to a two-dimensional display area including the X-axis and the Y-axis on the display device, and having an X-address input and a Y-address input; signal processing means connected to receive the waveform input signal for generating, from the waveform input signal, waveform value information on a waveform represented by the waveform input signal, and temporal information related to the waveform value information; Y-address generating means for generating a Y-address for the memory address space from the waveform value information, the Y-address being supplied to the Y-address input of the frame memory means; and X-address generating means for generating an X-address for the memory address space from the temporal information, and the X-address being supplied to the X-address input of the frame memory means. In this case, the mapping adjusting means may further include address changing amount generating means coupled to the continuous mapping adjusting means and the mapping resetting means for generating an X-address changing amount and a Y-address changing amount corresponding to a mapping adjustment amount; and adding means for adding the X-address changing amount and the Y-address changing amount to the X-address generated by the X-address generating means and the Y-address generated by the Y-address generating means, respectively. Further, the address changing amount generating means may set the X-address changing amount equal to a predetermined X-address reference value corresponding to the X-axis reference position in the two-dimensional display area when the mapping resetting means is operated for the X-axis, and set the Y-address changing amount equal to a predetermined Y-address reference value corresponding to the Y-axis reference position in the two-dimensional display area when the mapping resetting means is operated for the Y-axis.

The present invention also provides a display device which comprises the waveform display position adjusting apparatus.

DETAILED DESCRIPTION OF THE INVNETION

In the following, embodiments of the present invention will be described in detail with reference to the accompanying drawings.

Figure 1:
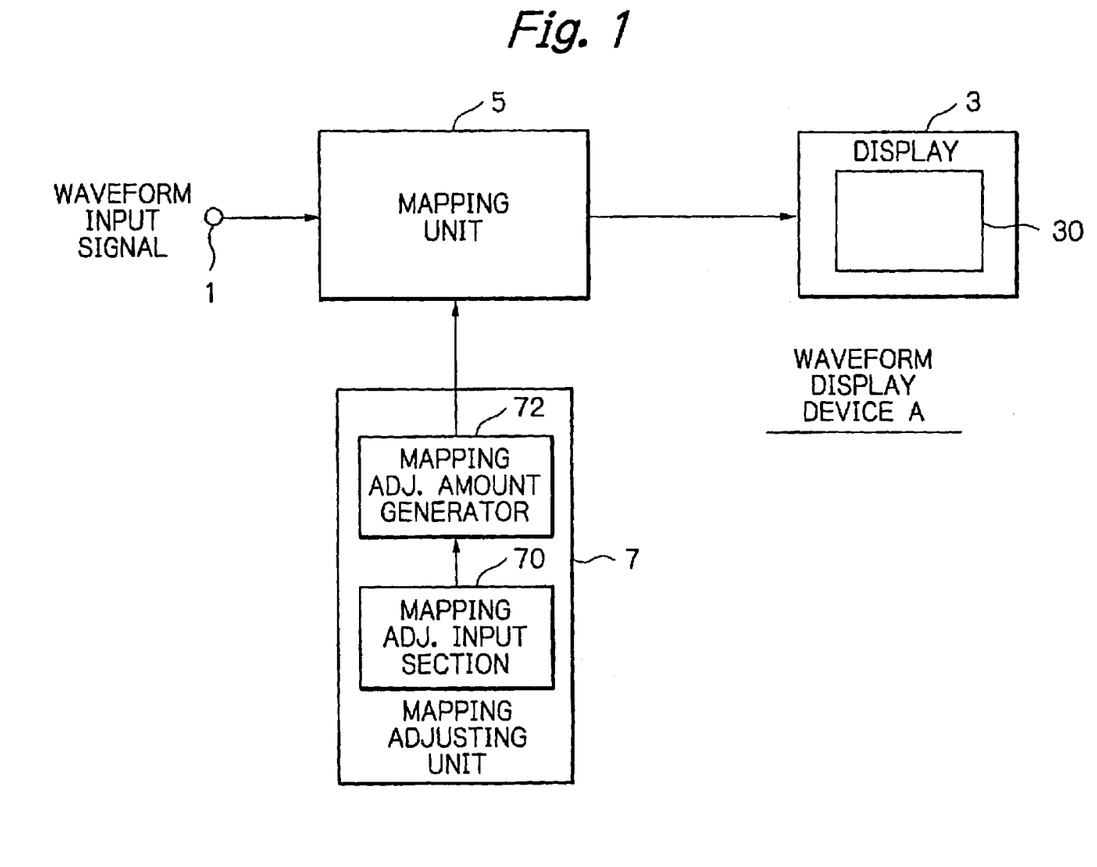
FIG. 1 is a block diagram illustrating one embodiment of a waveform display device which incorporates the present invention.

FIG. 1 is a block diagram illustrating one embodiment of a waveform display device which incorporates the present invention. As illustrated, the waveform display device A comprises an input terminal 1 for receiving a waveform input signal; a display 3 which has a screen 30 that provides a two-dimensional display area DS (shown in FIG. 2) for displaying a waveform; a mapping unit 5 for mapping a two-dimensional waveform value space WS (shown in FIG. 2) derived from the waveform input signal to a two-dimensional display area DS of the display 3; and a mapping adjusting unit 7. More specifically, the display 3 may be implemented by a display device such as a CRT and an LCD, by way of example, and the screen 30 typically has two axes orthogonal to each other: an X-axis which is a horizontal axis and a Y-axis which is a vertical axis. The mapping unit 5 has an input for receiving the waveform input signal from the input terminal 1, and an output for providing a signal indicative of a position on the screen 30 which is generated based on the position of the input signal in the two-dimensional waveform value space. The output is coupled to an input of the display 3 which displays a waveform in response to the generated signal at a corresponding position within the two-dimensional display area of the screen 30.

Figure 2:
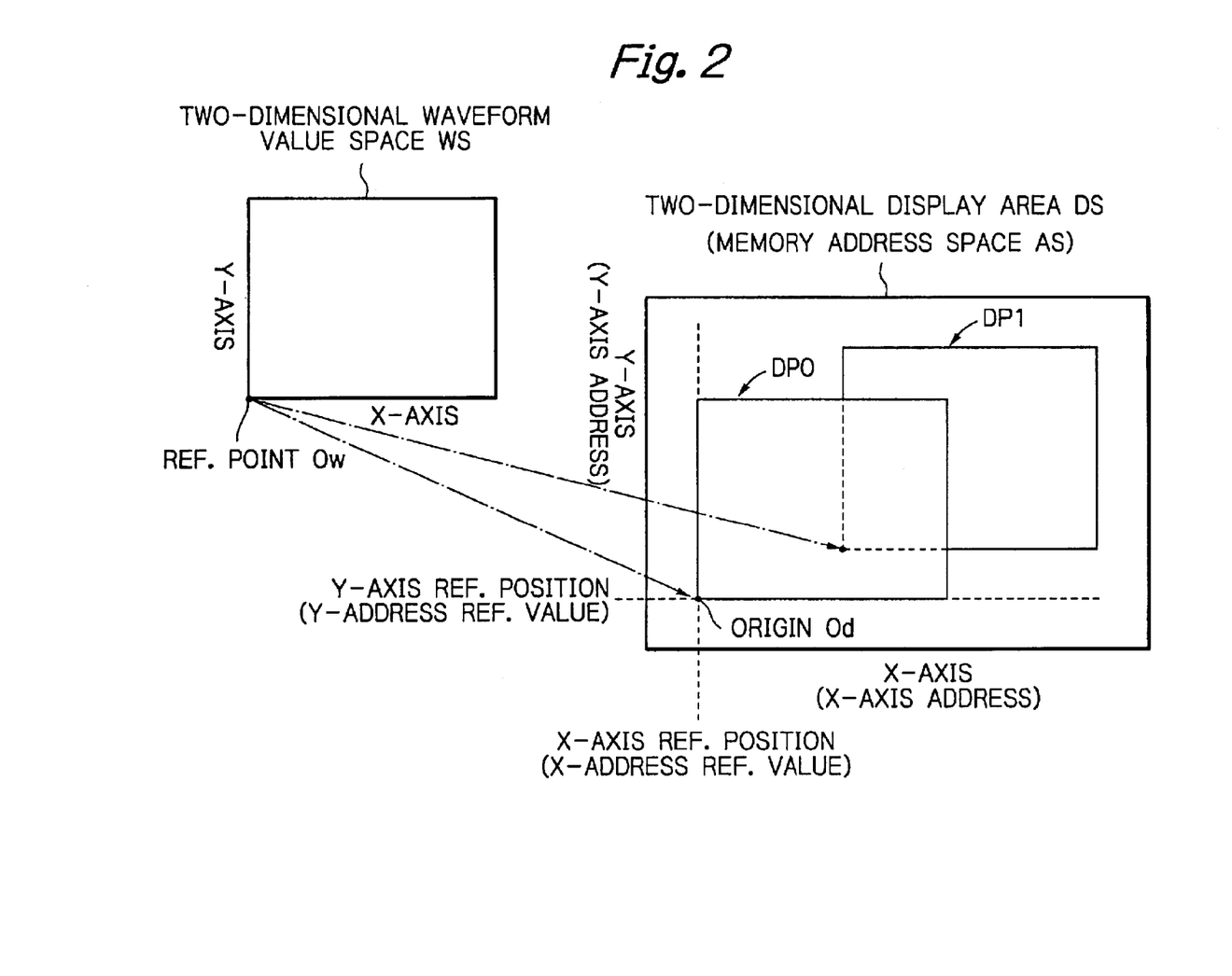
FIG. 2 is a diagram showing the relationship between a two-dimensional waveform value space WS formed by a waveform input signal and a two-dimensional display area DS provided by a screen of a display to which the space WS is mapped, in the waveform display device of FIG. 1 or FIG. 3.

Referring now to FIG. 2, the two-dimensional waveform value space WS refers to a virtual two-dimensional space related to waveform values of a waveform input signal, where the space is formed, for example, by values that can be taken by parameters independent or orthogonal to one another when these parameters are put on the X-axis and Y-axis. The parameters may be, for example, the waveform value, and a time associated with the waveform value, which are represented by the Y-axis and X-axis, respectively. The two-dimensional display area DS in turn refers to a display area in which the foregoing parameters are represented by the Y-axis and X-axis in correspondence to the two-dimensional waveform value space. Reference positions are defined for the respective axes at a position at which the parameter on the Y-axis is zero, and at a position at which the parameter on the X-axis is zero. In this case, the reference state for the Y-axis means that a zero point on the Y-axis in the waveform value space WS matches a reference position in the display area DS at which a zero point on the Y-axis exists. Similarly, the reference state for the X-axis means that a zero point on the X-axis in the waveform value space WS matches a reference position in the two-dimensional display area DS at which a zero point on the X-axis exists. In addition, the mapping used herein means that a space is mapped to another space or area. For convenience of illustration, the ratio in size of the waveform value space WS to the display area DS is set to unity, however, this scaling factor depends on the scaling factor of a display on the display 3, the extent of the space WS, an amplification ratio in signal processing, and the like.

The mapping adjusting unit 7 is coupled to the mapping unit 5 for adjusting the mapping in the mapping unit 5. The adjusting unit 7 comprises a mapping adjustment input section 70, and a mapping adjustment amount generator 72 which has an input connected to an output of the input section 70. Specifically, the input section 70 preferably has a function of continuously adjusting the mapping, and a function of resetting or initializing the mapping to a reference state. The generator 72 generates a mapping adjustment amount indicative of the input amount of mapping adjustment which is supplied to the mapping unit 5 from an output. The mapping adjustment amount is used for modifying the mapping in the mapping unit 5.

Referring next to FIG. 2, description will be made on the operation of the waveform display device A in the mapping and mapping adjustment. First, when the mapping is performed in the reference state both on the Y-axis and X-axis, i.e., when the adjustment amount is equal to zero in the mapping adjusting unit 7, the mapping unit 5 maps the waveform value space WS to the display area DS in a relative positional relationship in which the reference point Ow of the space WS matches the origin Od of the area DS. In this case, the mapping is in the reference state both on the X-axis and Y-axis, so that the space WS is displayed at a display position DP0 in the area DS. In this reference state, when the operator wishes to move the space WS (or a waveform existing in this space) from the display position DP0 to a display position DP1 shown in FIG. 2, the operator can manipulate the input section 70 to continuously adjust the mapping with respect to both the X-axis and Y-axis, thereby gradually moving the space WS from the display position DP0 to the display position DP1. Eventually, the space WS is defined at the display position DP1. Then, the reference point Ow of the space WS is displayed a certain distance apart from the origin Od of the area DS. Next, when the operator wishes to return the space WS from the display position DP1 to the display position DP0, the operator can manipulate the input section 70 to reset the mapping to the reference state both on the X-axis and Y-axis, such that the mapping adjustment amount to the mapping performed in the mapping unit 5 is initialized (i.e., adjusted to the adjustment amount corresponding to the reference positions on the X-axis and Y-axis) to instantaneously return the space WS to the display position DP0. As a result, the space WS can be instantaneously returned from the display position DP1 to the display position DP0 without continuous adjustment in the mapping adjustment input section 70.

Figure 3:
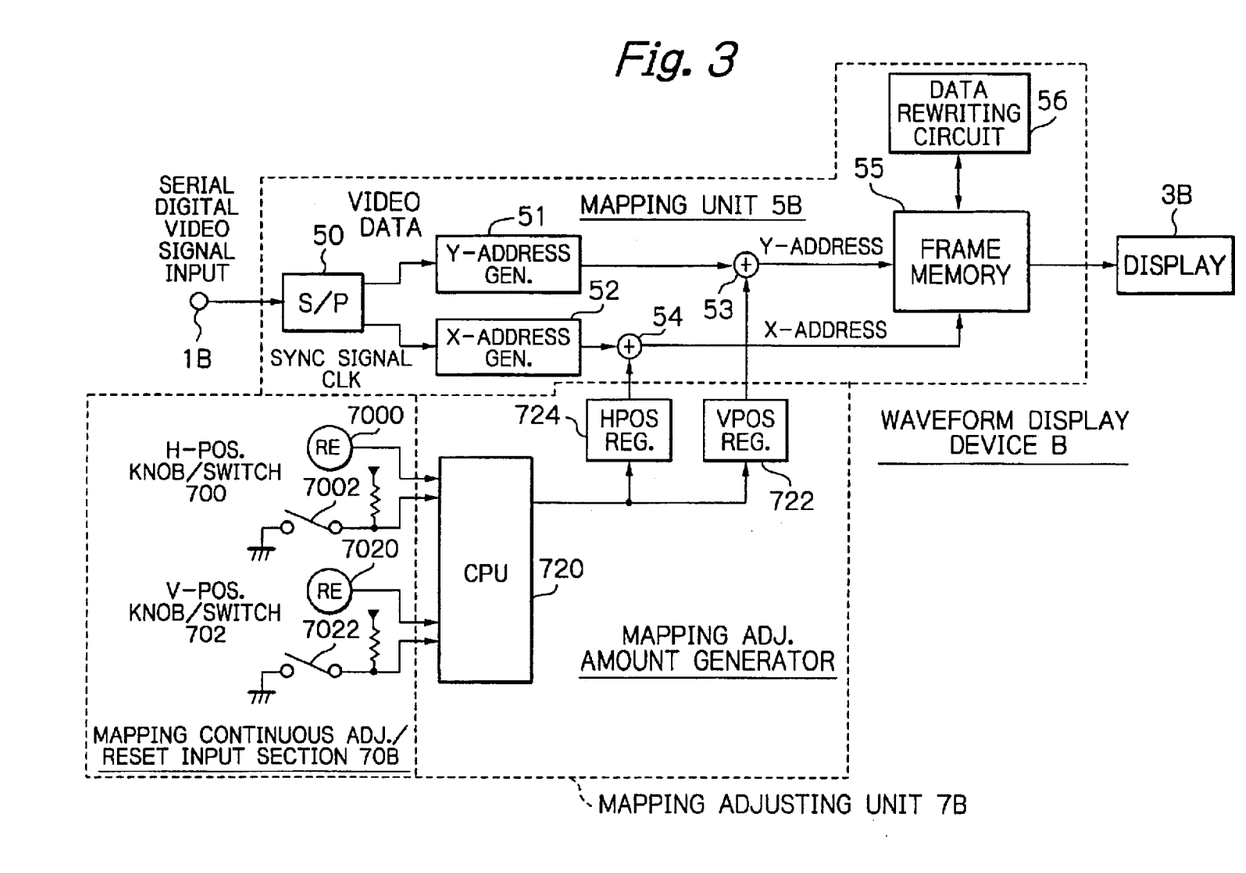
FIG. 3 is a block diagram illustrating a waveform display device which embodies the waveform display device A of FIG. 1 in more specific form.

Referring next to FIG. 3, description will be made on a waveform display device B which is a raster scan type waveform monitor in one embodiment of the present invention which embodies the waveform display device A of FIG. 1 in more specific form. Corresponding to the components in the waveform display device A of FIG. 1, the waveform display device B comprises an input terminal 1B: a display 3B; a mapping unit 5B for mapping a two-dimensional waveform value space WS of an input signal to a two-dimensional display area DS; and a mapping adjusting unit 7B. Since these components have similar functions to corresponding components in FIG. 1, the same reference numerals of their corresponding components are designated, followed by a symbol "B." It should be noted that this embodiment illustrates a waveform monitor, so that the input terminal 1B receives a serial digital video input signal as an input signal. The display 3B, which may be a LCD display, by way of example, has a screen 30B (shown in FIG. 4) which provides the two-dimensional display area DS in a matrix of 1024×768 dots. The display area DS has two axes orthogonal to each other: a horizontal (H) axis which is an example of the X-axis, and a vertical (V) axis which is an example of the Y-axis.

Describing in greater detail, the mapping unit 5B comprises an H-axis/V-axis parameter generator circuit 50; a Y-address generator 51 and an X-address generator 52; a Y-address adder 53 and an X-address adder 54; a frame memory 55; and a data rewriting circuit 56. Specifically, first of all, the frame memory 55 defines a memory address space AS comprised of 1024×768 addresses, corresponding to the display area DS over 1024×768 dots having the H-axis and Y-axis of the display 3B. The frame memory 55 has an X-address input for specifying one of 1024 X-axis (or H-axis) addresses; a Y-address input for specifying one of 768 Y-axis (or V-axis) addresses; a data input/output for rewriting data at an address specified by a set of the X-address and Y-address; and a data output for reading data to the display 3B. Next, the H-axis/V-axis parameter generator circuit 50, which comprises a serial/parallel converter, by way of example, has an input connected to the input terminal 1B. The parameter generator circuit 50 converts a serial digital video signal received at the input from a serial form to a video data in a parallel form which is generated at one of the two outputs. The value represented by this video data functions as a Y-axis parameter. The circuit 50 also generates a synchronization signal and a clock CLK at the other output. The synchronization signal is generated when a certain code region is detected in the parallel video data. Therefore, an elapsed time from the generation of the synchronization signal functions as an H-axis parameter.

Next, the Y-address generator 51 has an input connected to one output of the parameter generator circuit 50, and an output from which a Y-address (0–767) is generated from video data received at the input to specify a Y-axis address within the address space AS of the frame memory 55. Specifically, the black level of a video signal is defined at address 0, and the Y-address generator 51 generates an address for a level higher than the black level, which has a value proportional to the particular level. The X-address generator 52 in turn has an input connected to the other output of the parameter generator circuit 50, and is triggered by the synchronization signal received at this input to generate an X-address (0–1023) which specifies an X-axis address within the address space AS. Specifically, the time at which the synchronization signal is generated is defined as address 0, and the X-address generator 52 increments the address every clock, and generates address 1023 when one horizontal period finishes. The Y-address adder 53 has two inputs, one of which is connected to the output of the Y-address generator 51, and adds a Y-address changing amount from the mapping adjusting unit 7B, received at the other input, to the Y-address received from the Y-address generator 51, such that a final Y-address, resulting from the addition, is generated at its output. This output is connected to the Y-address input of the frame memory 55. The X-address adder 54 in turn has two inputs, one of which is connected to the output of the X-address generator 52, and adds an X-address changing amount from the adjusting unit 7B, received at the other input, to an X-address generated by the X-address generator 52, such that a final X-address, resulting from the addition, is generated at its output. This output is connected to the X-address input of the frame memory 55. The respective Y-address and X-address changing amounts at the other inputs of the X-address and Y-address adders 53 and 54 are chosen in an initial or reference state to be a Y-address reference value corresponding to the Y-axis reference position in the display area DS and an X-address reference value corresponding to the X-axis reference position in the display area DS, respectively, shown in FIG. 2. Specifically, they are set to "44" and "74," respectively. When the frame memory 55 receives such Y-address and X-address, the data rewriting circuit 56 coupled to the frame memory 55 rewrites data wherein data is read from the specified address, the data is incremented by a certain value, and the resulting data is rewritten into the frame memory 55 at the same address. A limit value is provided for the data rewrite, such that the address is not increased beyond the limit value. The contents of the frame memory 55 are then read and supplied to the display 3B which displays a waveform in the display area DS corresponding to the address space AS.

The mapping adjusting unit 7B, similar to the device A of FIG. 1, comprises a mapping continuous adjustment/reset input section 70B, and a mapping changing amount generator 72B. Specifically, the input section 70B comprises an H-position (HPOS) knob/switch 700 for adjusting the H-position of a displayed waveform; and a V-position (VPOS) knob/switch 702 for adjusting the V-position of the displayed waveform. Each of the H-position knob/switch 700 and V-position knob/switch 702 comprises a set of rotary encoder 7000 or 7020 for continuous position adjustment, and a reset switch 7002 or 7022 for resetting the position. The two sets of adjustment/input features permit adjustments of the H-position and V-position independently from each other. More specifically, each of the rotary encoders continuously generates a pulse when an operator rotates a knob (shown in FIG. 4) coupled to the encoder, up to a number of pulses corresponding to the angle over which the operator rotates the knob to indicate how far a displayed waveform should be moved. Each of the reset switches generates a signal which is normally at high but transitions to low to indicate a reset, when the switch is turned on, thereby forming a reset signal for a vertical or horizontal display position.

Figure 4:
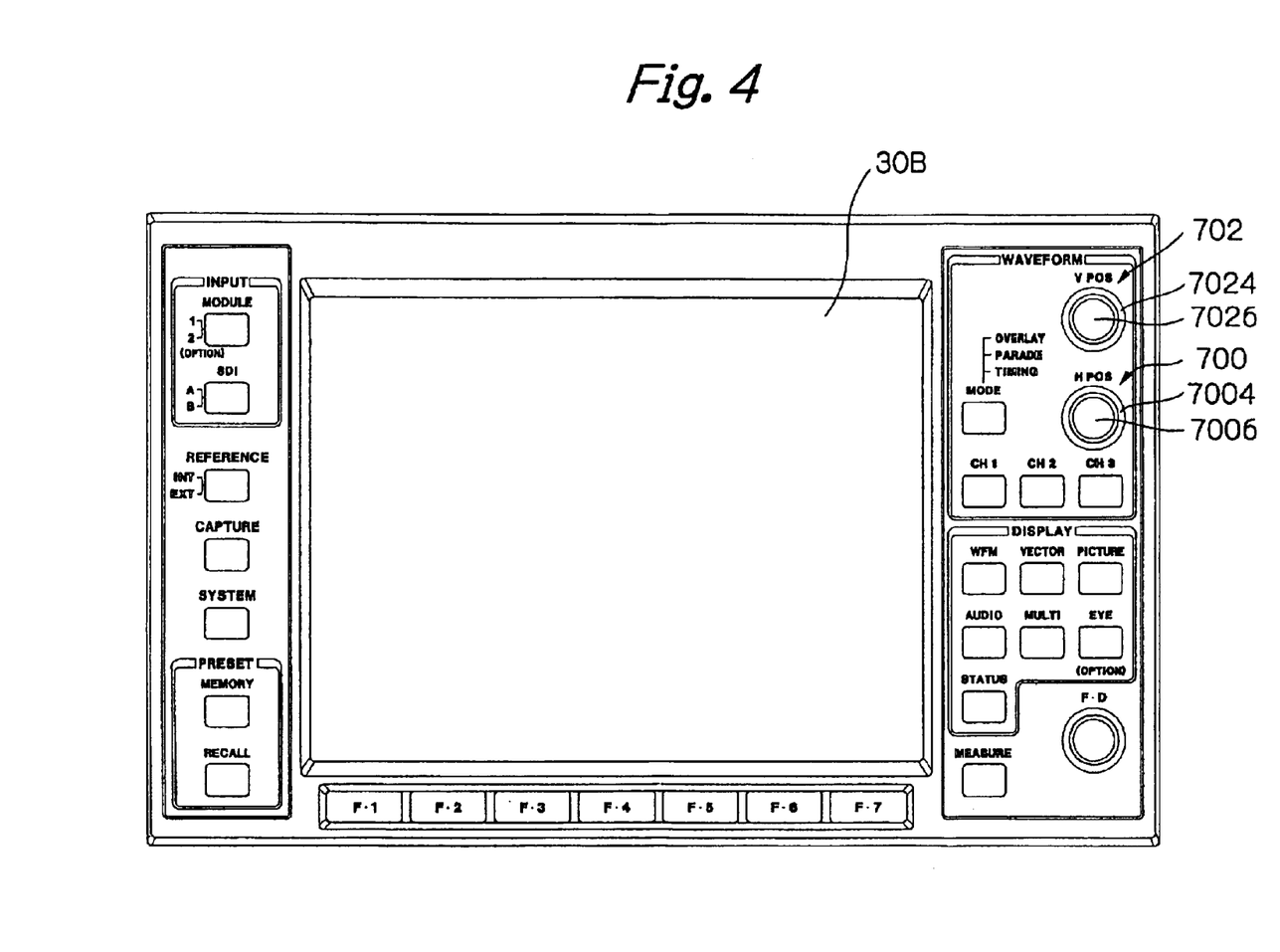
FIG. 4 is a front view illustrating an operation panel of the waveform display device B of FIG. 3.

FIG. 4 illustrates a front view of an operation panel of a monitor which implements the waveform display device B. As can be also seen from FIG. 4, each position adjustment knob/switch 700 or 702 comprises a knob 7004 or 7024 for operating the rotary encoder 7000 or 7020; and a switch button 7006 or 7026 for operating a reset switch 7002 or 7022. Each of the switch buttons is arranged coaxial with and adjacent to a knob associated therewith in an integrated structure. In this way, since the switch buttons are disposed adjacent to the knobs, the operator can operate the switch button with his or her hand placed substantially at the same position at which the operator is continuously adjusting the position with the associated knob. In addition, the operation involves a simple one-touch operation which requires the operator to merely push the button. Other switches and the like shown in FIG. 4 are not directly related to the present invention, so that description thereon is omitted.

The mapping changing amount generator 72B comprises a microprocessor or CPU 720; a V-position register 722; and an H-position register 724. The CPU 720 has inputs which are connected to a set of movement amount and reset outputs from the H-position knob/switch 700 of the input section 70B, and a set of movement amount and reset outputs from the V-position knob/switch 702. The CPU 720 generates an address changing amount, as a mapping changing amount, i.e., X-address and Y-address changing amounts at its outputs based on the received inputs, i.e., position adjustment amounts. The V-position register 722 has an input connected to the output of the CPU 720, such that a Y-address changing amount received from the CPU 720 is stored and generated at its output. The H-position register 724 in turn has an input connected to the output of the CPU 720, such that an X-address changing amount received from the CPU 720 is stored and generated at its output. The respective outputs of the registers 722 and 724 are connected to the inputs of the associated address adders 53 and 54, respectively, so that the X- and Y-address changing amounts are added to the X-address and Y-address, respectively, from the generators 51 and 52, as described above. In this way, a displayed position is adjusted by changing the address which specifies the position in the address space AS. The data rewriting circuit 56 rewrites data at the changed address to change the position at which a waveform is displayed.

Figure 5:
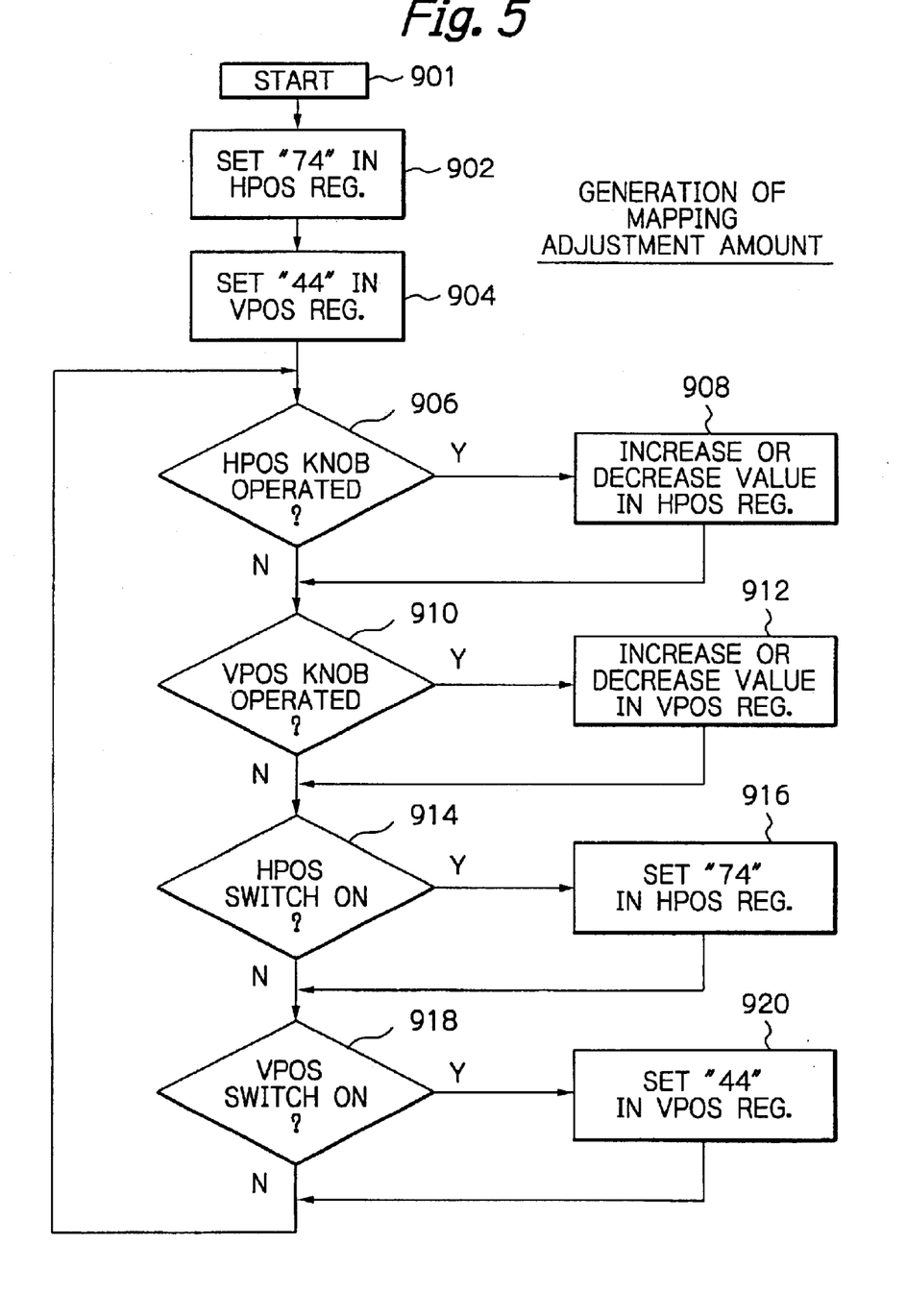
FIG. 5 is a flow chart illustrating an operation flow executed by a CPU shown in FIG. 4 for generating a mapping changing amount.
Figure 6A:
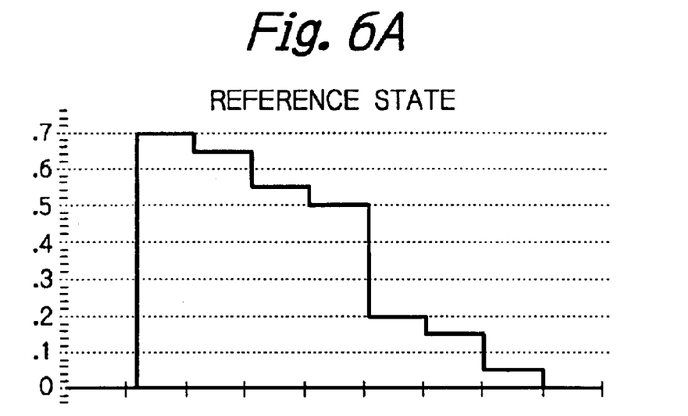
FIGS. 6A, 6B and 6C show exemplary displays of a waveform of a video signal, when it is initialized to a reference state (FIG. 6A), when the H-position is changed (FIG. 6B), and when the V-position is changed (FIG. 6C).
Figure 6B:
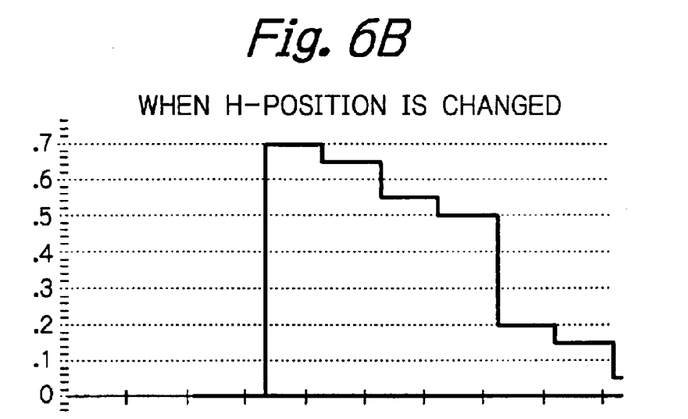

Referring next to FIG. 5, description will be made on a flow of operation executed by the CPU 720 to generate a mapping changing amount. The operation flow starts at step 901, and the V-position and H-position registers 722 and 724 are loaded with initial values of address changing amounts, respectively, at steps 902 and 904 for initialization. Specifically, the V-position register 722 is loaded with the Y-address reference value "44," while the H-position register 724 is loaded with the X-address reference value "74." This causes the reference point Ow of the space WS to position at the origin Od of the display area DS, as previously shown in FIG. 2. FIG. 6A shows an exemplary waveform of a video signal which is displayed in the initialized state, i.e., in the reference state. As can be seen from this exemplary display, the position indicative of voltage 0 is positioned at the origin at time 0. Next, at step 906, it is determined from the presence or absence of pulses from the rotary encoder 7000 whether the operator is operating the H-position (HPOS) knob 7004. Then, the address changing amount is continuously increased or decreased in real time, corresponding to the number of generated pulses and the polarity (whether the knob is rotated clockwise or counterclockwise) at step 908, and in the meantime, the HPOS register 724 is loaded with the continuously increasing or decreasing address changing amount. FIG. 6B shows an exemplary display resulting from the foregoing operation.

Figure 6C:
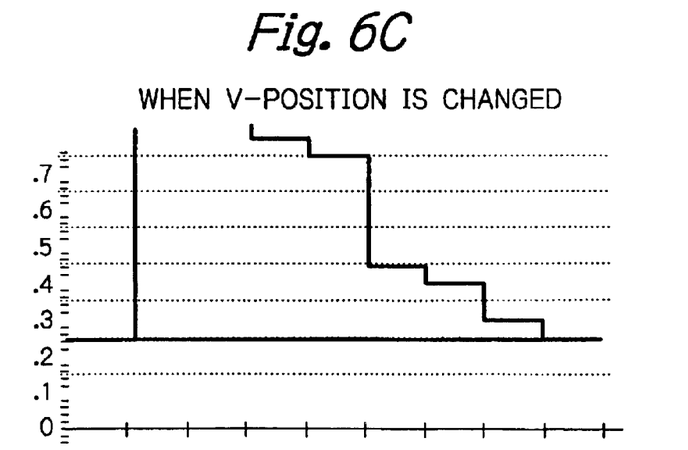

After step 908 or if NO at step 906, it is determined at step 910 from the presence or absence of pulses from the rotary encoder 7020 whether the operator is operating the V-position (VPOS) knob 7024. Then, the address changing amount is continuously increased or decreased corresponding to the number of generated pulses and the polarity (whether the knob is rotated clockwise or counterclockwise) at step 912, and in the meantime, the VPOS register 722 is loaded with the continuously increasing or decreasing address changing amount. FIG. 6C shows an exemplary display resulting from the foregoing operation. After step 912 or if NO at step 910, the operation flow proceeds to step 914, where it is determined whether the HPOS reset switch 7002 is turned ON. If YES at step 914, the HPOS register 724 is loaded with "74" at step 916, which is the X-address reference value. Thus, the H-position is reset to the reference state. Consequently, when a displayed waveform remains, for example, at the display position shown in FIG. 6B, this resetting operation instantaneously returns the waveform to the display position shown in FIG. 6A. When the waveform remains at the display position shown in FIG. 6C, no change is induced in the display position by the operation on the HPOS reset switch 7002 because the H-position is in the reference state at this display position. Next, after step 916 or if NO at step 914, the operation flow proceeds to step 918, where it is determined whether the VPOS reset switch 7022 is turned ON. If YES, the VPOS register 722 is loaded with "44" at step 920, which is the Y-address reference value. Thus, the V-position is reset to the reference state. Consequently, when the displayed waveform remains, for example, at the display position shown in FIG. 6C, this resetting operation instantaneously returns the waveform to the display position shown in FIG. 6A. Similar to the foregoing, when the displayed waveform remains at the position shown in FIG. 6B, no change is induced in the display position by the operation on the VPOS reset switch 7022 because the V-position is in the reference state at this display position. In this way, the reset function is provided on the V-axis or H-axis or both, in addition to a continuous adjustment, so that a displayed waveform can be instantaneously returned to an original display position by the reset function through a simple operation. This function is advantageously applicable when a displayed waveform is enlarged or reduced with a change in a displayed position of the waveform for observing a variety of different regions of the waveform. When the displayed waveform is returned to the original display scale, the waveform can be instantaneously returned to the original display position.

A variety of modifications can be made to the above described embodiment of the present invention. First, the foregoing embodiment has been described in connection with a waveform monitor which has a two-dimensional waveform value space defined by the X-axis representative of the time (H-axis) and the Y-axis representative of the waveform value (V-axis). Alternatively, the X-axis may represent the amplitude of a signal component, while the Y-axis may represent the amplitude of another signal component. Second, the Y-axis and X-axis may not be axes orthogonal to each other. Third, in the foregoing embodiment, the reference state of display is defined at the zero point on the scale on each axis which is used as the reference position. The reference position, however, may be at any point on the scale other than the zero point. Fourth, the present invention can be applied to other waveform display devices such as a digital oscilloscope. Fifth, the adjustment knob and reset switch need not be arranged in an integrated structure, but may be separated as long as they are positioned adjacent to each other.

According to the present invention described above, a position at which a waveform is displayed can be reset only with a movement of a finger, thereby reducing or eliminating a movement of an entire hand. This permits the operator to rapidly and simply return a waveform to a reference position through a simple one-touch operation with a reduced number of erroneous operations. In addition, the operability is improved for the overall adjustment of a waveform displayed position. Furthermore, a waveform can be more simply, readily and rapidly observed on the waveform display device.

What is claimed is:

1. A waveform display position adjusting method for adjusting a position at which a waveform is displayed on a waveform display device which has a two-dimensional display area, said two-dimensional display area having an X-axis and a Y-axis, said method comprising the steps of:
continuously adjusting mapping of a waveform input value in a two-dimensional waveform value space to said two-dimensional display area by using continuous adjusting means, said mapping including:
defining a memory address space specified by an X-address and a Y-address, said memory address space corresponding to said two dimensional display area including the X-axis and the Y-axis on said display device;
generating, from said waveform input signal, waveform value information on a waveform represented by said waveform input signal, and temporal information related to said waveform value information,
generating, from said waveform value information, the Y-address for specifying an address in said memory address space;
generating, from said temporal information, the X-address for specifying the address in said memory address space; and
resetting said mapping to a reference state by using switching means arranged adjacent to said continuous adjusting means.

2. A waveform display position adjusting method according to claim 1, wherein:
said mapping adjustment includes an adjustment of a position of said two-dimensional waveform value space relative to said two-dimensional display area in said mapping.

3. A waveform display position adjusting method according to claim 1, wherein:
said reference state comprises:
an X-axis reference state for said X-axis, wherein a reference point in said two-dimensional waveform value space is located at an X-axis reference position in said two-dimensional display area; and
a Y-axis reference state for said Y-axis, wherein a reference point in said two-dimensional waveform value space is located at a Y-axis reference position in said two-dimensional display area.

4. A waveform display position adjusting method according to claim 3, wherein;
said reference point in said two-dimensional waveform value space is situated at a point at which a value on the X-axis and a value on the Y-axis are both zero.

5. A waveform display position adjusting method according to claim 3, wherein:
said mapping is reset to said reference state for one or both of said X-axis reference state and said Y-axis reference state.

6. A waveform display position adjusting method according to claim 1, wherein the adjustment of said mapping in said continuous adjusting step and said resetting step includes the steps of:
generating an X-address changing amount and a Y-address changing amount corresponding to a mapping adjustment amount; and
adding said X-address changing amount and said Y-address changing amount to said X-address and said Y-address, respectively.

7. A waveform display position adjusting method according to claim 7, wherein said resetting step includes:
setting said X-address changing amount equal to a predetermined X-address reference value corresponding to said X-axis reference position in said two-dimensional display area when said mapping resetting means is operated for said X-axis; and
setting said Y-address changing amount equal to a predetermined Y-address reference value corresponding to said Y-axis reference position in said two-dimensional display area when said mapping resetting means is operated for said Y-axis.

8. A waveform display position adjusting apparatus for adjusting a position at which a waveform represented by a waveform input signal is displayed on a waveform display device having a two-dimensional display area, said two-dimensional display area having an X-axis and a Y-axis, said apparatus comprising:
mapping circuitry configured to map a two-dimensional waveform value space for a waveform input value derived from said waveform input signal to said two-dimensional display area of said waveform display device; and mapping adjusting circuitry coupled to said mapping circuitry and configured to adjust mapping by the mapping circuitry, the mapping adjusting circuitry including:

continuous mapping adjusting circuitry coupled to said mapping circuitry and configured to continuously adjust said mapping; and mapping resetting circuitry coupled to said mapping circuitry and arranged adjacent to said continuous mapping adjusting circuitry for resetting said mapping to a predetermined reference state, wherein said continuous mapping adjusting circuitry and said mapping resetting circuitry include a set of a rotary encoder and a reset switch associated with said X-axis.

9. A waveform display position adjusting apparatus according to claim 8, wherein:

said mapping adjustment includes an adjustment of a position of said two-dimensional waveform value space relative to said two-dimensional display area in said mapping.

10. A waveform display position adjusting apparatus according to claim 10, wherein said reference state comprises:

an X-axis reference state for said X-axis, wherein a reference point in said two-dimensional waveform value space is located at an X-axis reference position in said two-dimensional display area; and a Y-axis reference state for said Y-axis, wherein a reference point in said two-dimensional waveform value space is located at a Y-axis reference position in said two-dimensional display area.

11. A waveform display position adjusting apparatus according to claim 10, wherein:

said mapping is reset to said reference state for one or both of said X-axis reference state and said Y-axis reference state.

12. A waveform display position adjusting apparatus according to claim 9, wherein:

said continuous mapping adjusting circuitry and said mapping resetting circuitry farther include a set of a rotary encoder and a reset switch associated with said Y-axis.

13. A waveform display position adjusting apparatus for adjusting a position at which a waveform represented by a waveform input signal is displayed on a waveform display device having a two-dimensional display area, said two-dimensional display area having an X-axis and a Y-axis, said apparatus comprising:

mapping circuitry configured to map a two-dimensional waveform value space for a waveform input value derived from said waveform input signal to said two-dimensional display area of said waveform display device, wherein said mapping circuitry includes:

frame memory circuitry having a memory address space corresponding to a two-dimensional display area including the X-axis and the Y-axis on said display device, said frame memory circuitry having an X-address input and a Y-address input;

signal processing circuitry connected to receive said waveform input signal and operable to generate, from said waveform input signal, waveform value information on a waveform represented by said waveform input signal, and temporal information related to said waveform value information;

Y-address generating circuitry operable to generate a Y-address for said memory address space from said waveform value information, and to supply said Y-address to said Y-address input of said frame memory circuitry; and X-address generating circuitry operable to generate an X-address for said memory address space from said waveform value information, and to supply said X-address to said X-address input of said frame memory circuitry; and mapping adjusting circuitry coupled to said mapping circuitry and configured to adjust mapping by the mapping circuitry, the mapping adjusting circuitry including:

continuous mapping adjusting circuitry coupled to said mapping circuitry and configured to continuously adjust said mapping; and mapping resetting circuitry coupled to said mapping circuitry and arranged adjacent to said continuous mapping adjusting circuitry for resetting said mapping to a predetermined reference state.

14. A waveform display position adjusting apparatus according to claim 13, wherein said mapping adjusting circuitry further includes:

address changing amount generating circuitry coupled to said continuous mapping adjusting circuitry and said mapping resetting circuitry and operable to generate an X-address changing amount and a Y-address changing amount corresponding to a mapping adjustment amount; and adding circuitry operable to add said X-address changing amount and said Y-address changing amount to said X-address generated by said X-address generating circuitry and said Y-address generated by said Y-address generating circuitry, respectively.

15. A waveform display position adjusting apparatus according to claim 14, wherein:

said address changing amount generating circuitry sets said X-address changing amount equal to a predetermined X-address reference value corresponding to said X-axis reference position in said two-dimensional display area when said mapping resetting circuitry is operated for said X-axis, and sets said Y-address changing amount equal to a predetermined Y-address reference value corresponding to said Y-axis reference position in said two-dimensional display area when said mapping resetting circuitry is operated for said Y-axis.

16. A waveform display position adjusting apparatus according to claim 13, wherein said continuous mapping adjusting circuitry and said mapping resetting circuitry include a set of a rotary encoder and a reset switch associated with said X-axis.

17. A display device comprising a waveform display position adjusting apparatus according to any of the claims 9 to 12 or 14 to 15.

* * * * *